United States Patent
Dejardin

(10) Patent No.: US 11,184,998 B2
(45) Date of Patent: Nov. 23, 2021

(54) ELECTRONIC DEVICE PROVIDED WITH AN ANTENNA INTEGRATED INTO A HEATSINK

(71) Applicant: SAGEMCOM BROADBAND SAS, Rueil Malmaison (FR)

(72) Inventor: Romain Dejardin, Rueil Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 661 days.

(21) Appl. No.: 15/531,305

(22) PCT Filed: Nov. 27, 2015

(86) PCT No.: PCT/EP2015/077983
§ 371 (c)(1),
(2) Date: May 26, 2017

(87) PCT Pub. No.: WO2016/087335
PCT Pub. Date: Jun. 9, 2016

(65) Prior Publication Data
US 2017/0346152 A1    Nov. 30, 2017

(30) Foreign Application Priority Data

Dec. 3, 2014 (FR) ...................... 1461882

(51) Int. Cl.
*H05K 7/20* (2006.01)
*H01Q 1/44* (2006.01)
*H01Q 1/02* (2006.01)

(52) U.S. Cl.
CPC ............. *H05K 7/2039* (2013.01); *H01Q 1/02* (2013.01); *H01Q 1/44* (2013.01); *H05K 7/20509* (2013.01)

(58) Field of Classification Search
CPC .... H05K 7/2039; H05K 7/20509; H01Q 1/02; H01Q 1/44; G06F 1/20; G06F 1/203
USPC ........ 361/704, 709–711, 719; 165/80.2, 185; 257/713
See application file for complete search history.

(56) References Cited

U.S. PATENT DOCUMENTS

| | | | |
|---|---|---|---|
| 8,681,501 B2* | 3/2014 | Govindasamy | G06F 1/203 174/16.3 |
| 2013/0009320 A1* | 1/2013 | Yoo | H01L 23/49827 257/774 |
| 2013/0208427 A1* | 8/2013 | Lin | H01L 23/40 361/720 |
| 2014/0139400 A1 | 5/2014 | Voss et al. | |

FOREIGN PATENT DOCUMENTS

DE    202009001821 U1    4/2009

* cited by examiner

*Primary Examiner* — Zachary Pape
(74) *Attorney, Agent, or Firm* — Muncy, Geissler, Olds & Lowe, P.C.

(57) ABSTRACT

Electronic device including a housing enclosing an electronic board and a heatsink having a first face applied against the electronic board and, opposite, a second face making contact with the housing, an antenna being electrically connected to the electronic board and extending flatly between the heatsink and the housing while making contact with the heatsink and the housing.

9 Claims, 1 Drawing Sheet

ELECTRONIC DEVICE PROVIDED WITH AN ANTENNA INTEGRATED INTO A HEATSINK

BACKGROUND OF THE INVENTION

Field of the Invention

The present invention relates to transmitting data by electromagnetic radiation.

Brief Discussion of the Related Art

Electronic devices exist that comprise a box housing specifically an electronic card that is electrically connected to an antenna, and a heatsink for dissipating the heat produced by one or more electronic components of the card while they are in operation. The heatsink has a first face that is applied against the electronic card, and an opposite, second face that is in contact with the box.

The antenna is generally made directly on an edge of the electronic card by etching (e.g. an inverse F antenna (IFA)) or it projects directly from an edge of the electronic card (e.g. an embedded antenna with a UFL connector).

Unfortunately, numerous devices incorporate elements that are solid and electrically conductive, such as a heatsink, that mask the antenna in part, and that have an effect on its directivity and thus on its performance.

SUMMARY OF THE INVENTION

An object of the invention is to provide an electronic device presenting better performance for data transmission by electromagnetic radiation.

To this end, the invention provides an electronic device comprising a box containing an electronic card and a heatsink. The heatsink has a first face applied against the electronic card, and an opposite, second face having a portion in contact with the box. An antenna is electrically connected to the electronic card and extends flat at least in part between the heatsink and the box. The antenna extends around the portion of the second face of the heatsink that is in contact with the box.

Thus, the antenna has maximum clearance since it is as close as possible to the outside of the box and it is not masked by the heatsink. The dimensions of the antenna are thus maximized by making best possible use of a portion of the volume available inside the box.

Preferably, the antenna is in contact with the heatsink and with the box. This improves heat exchange between the heatsink and the box.

Also preferably, the heatsink is electrically connected to an electrical ground of the card.

The heatsink may be used to form a reference plane of the antenna. The reference plane formed by the heatsink is then not a floating reference.

Other characteristics and advantages of the invention appear on reading the following description of particular, non-limiting embodiments of the invention.

BRIEF DESCRIPTION OF THE DRAWINGS

Reference is made to the accompanying drawing, in which.

DETAILED DESCRIPTION OF THE PREFERRED EMBODIMENTS

Figure 1:
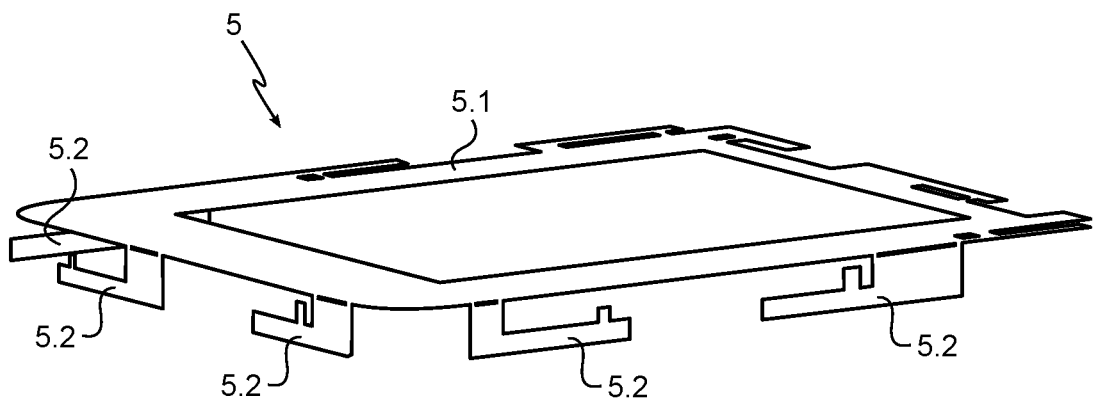
FIG. 1 is a perspective view of the antenna of the device.
Figure 2:
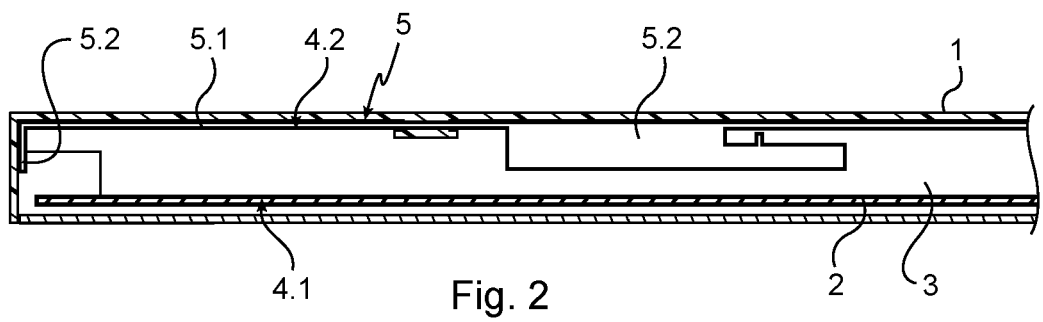
FIG. 2 is a diagrammatic view, partially in cross-section, of a device of the invention.

With reference to the figures, the electronic device of the invention comprises a box 1 containing an electronic card 2 and a passive heatsink 3.

The box 1 is of conventional type, and for example it is generally of rectangular box shape. The box 1 is made of an electrically insulating material, in this example a thermoplastic material.

In conventional manner, the electronic card 2 comprises a printed circuit board having electronic components mounted thereon. The electronic device also includes a power supply unit connected to the electronic card 2 and provided with means for connection to the electricity network, and an input/output unit enabling the electronic card 2 to exchange signals with the outside.

The heatsink 3 has a first face 4.1 pressed against the components of the electronic card 2, and it has an opposite second face 4.2 in contact with the box 1. The heatsink 3 is made of thermally conductive material, in this example of a metal such as aluminum or copper, and it is electrically connected to the electrical ground of the electronic card 2. In this example, the heatsink 3 is generally in the shape of a rectangular block, and it has four flanks at right angles to one another.

The electronic device has an antenna 5 that is electrically connected to the input/output unit of the electronic card 2.

The antenna 5 extends flat against the second face 4.2 of the heatsink 3 between said second face 4.2 and the top inside surface of the box 1. More precisely, the antenna 5 comprises a ring 5.1 received in a groove 4.3 formed in the second face 4.2 along the periphery of the second face 4.2 of the heatsink 3. The antenna 5 thus extends around the central portion of the second face 4.2 in contact with the box 1.

The ring 5.1 extends around a rectangular outline and possesses two adjacent outer edges, each having at least one additional radiating portion 5.2 that extends along a flank 4.4 of the heatsink 3.

In this example, the antenna 5 is made of tinned sheet or of copper and is of a thickness that gives it sufficient flexibility to fit closely to the shape of the second surface 4.2 of the heatsink 3. The antenna has a thickness of 0.5 millimeters (mm) approximately and the groove 4.3 has a depth that is slightly less than or equal to that thickness. The antenna is fastened to the box 1. Fastening is achieved in conventional manner by thermoplastic staking or "heading". The box 1 has pegs that project from its top inside surface and that are received in holes made in the antenna 5. The pegs have respective free ends that are flattened while hot so as to oppose separation of the peg from the hole in the antenna.

In order to maximize heat dissipation, as large a portion as possible of the first face 4.1 of the heatsink 3 must be in contact with the electronic card 2, and as large a portion as possible of the second face 4.2 of the heatsink 3 must be in contact with the top inside surface of the box 1. The antenna 5 preferably extends substantially in the same plane as the top second face 4.2 in order to be clamped between the heatsink 3 and the top inside surface of the box 1.

Figure 3:
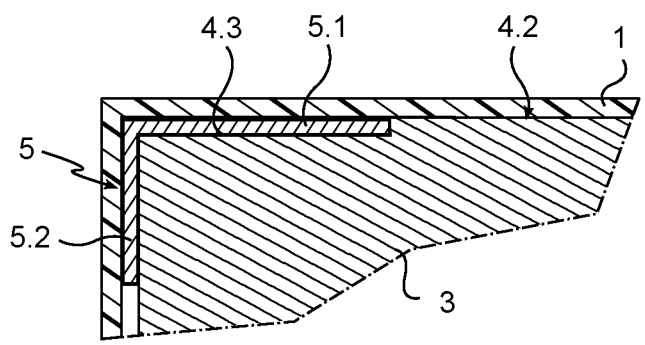
FIG. 3 is a detail view in cross-section of the device.
Figure 4:
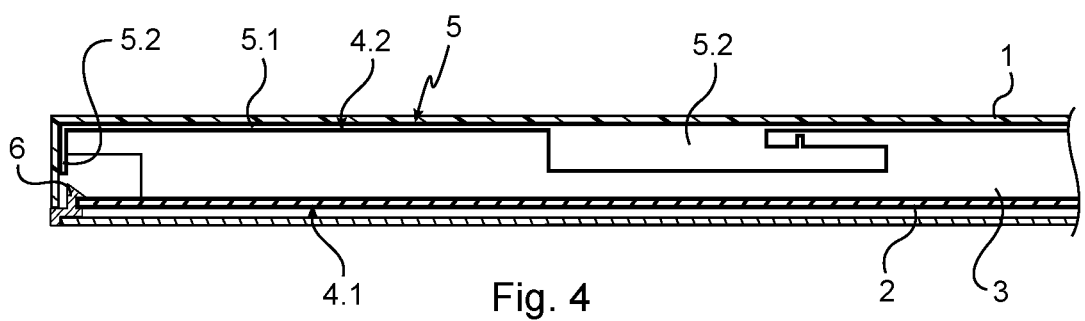
FIG. 4 is a view analogous to FIG. 1 showing a device in another variant embodiment of the invention.

In the variant of FIG. 3, the antenna 5 is fastened to the heatsink 3, which is fastened to the electronic card 2, which is clipped inside the box 1 via resilient catch arms 6.

Naturally, the invention is not limited to the embodiments described but covers any variant coming within the ambit of the invention as defined by the claims.

In particular, the shapes of the box and of the heatsink are given purely by way of indication, with other shapes being possible, in particular as a function of providing the box with attractive appearance and of matching the heatsink to the inside volume available inside the box.

Only a portion of the second face of the heatsink need be in contact with the box, or all of the second face may be in contact therewith.

The antenna 5 may be mounted without using any groove, providing its thickness is small.

The antenna 5 may be fastened to the box 1 by clip-fastening.

The antenna 5 may be fastened to the heatsink 3 by clip-fastening: the antenna 5 has resilient arms extending from the outside edges of the ring 5.1, each having a free end provided with a step engaged in a setback of the heatsink 3.

Although the antenna is described as having outside dimensions equal to the outside dimensions of the heatsink, the antenna could have outside dimensions smaller than or greater than the outside dimensions of the heatsink (when greater than the heatsink, the antenna should be fastened to the box and have inside dimensions smaller than the outside dimensions of the heatsink in order to make contact therewith).

The shape of the antenna 5 may be different from that described. Thus, the antenna 5 may have some other number of additional radiating portions, or it need not have any such additional radiating portions.

The antenna may be fastened by other means, and in particular by screw-fastening, crimping, clamping, wedging, . . . .

The heatsink may be made of a material that does not conduct electricity and it need not be connected to the electrical ground of the electronic card.

The electronic device may have a plurality of antennas.

The invention claimed is:

1. An electronic device comprising a box containing an electronic card and a heatsink having a first face applied against the electronic card, and an opposite, second face having a portion in contact with the box, an antenna being electrically connected to the electronic card and extending flat at least in part between the heatsink and the box around the portion of the second face that is in contact with the box.

2. The electronic device according to claim 1, wherein the antenna is in contact with the heatsink and with the box.

3. The device according to claim 1, wherein the heatsink is electrically connected to the electrical ground of the electronic card.

4. The device according to claim 1, wherein the antenna extends in a groove made along an outline of the second face of the heatsink.

5. The device according to claim 4, wherein the antenna comprises a ring having an outer edge from which at least one radiating portion extends along a flank of the heatsink.

6. The device according to claim 5, wherein the heatsink has two flanks forming an angle between them and the antenna has at least two radiating portions, each extending along a respective one of the flanks of the heatsink.

7. The device according to claim 1, wherein the antenna is fastened to the box.

8. The device according to claim 7, wherein the fastening is achieved by heading.

9. The device according to claim 1, wherein the antenna is fastened to the heatsink.

* * * * *